US012673583B2

(12) United States Patent
Menold et al.

(10) Patent No.: US 12,673,583 B2
(45) Date of Patent: Jul. 7, 2026

(54) STARTUP FAULT CHECKING OF PARALLELED DEVICES

(71) Applicant: Caterpillar Inc., Peoria, IL (US)

(72) Inventors: Rodney L. Menold, Hanna City, IL (US); Jason Lee Miller, Princeville, IL (US)

(73) Assignee: Caterpillar Inc., Peoria, IL (US)

( * ) Notice: Subject to any disclaimer, the term of this patent is extended or adjusted under 35 U.S.C. 154(b) by 96 days.

(21) Appl. No.: 18/675,126

(22) Filed: May 27, 2024

(65) Prior Publication Data

US 2025/0360837 A1     Nov. 27, 2025

(51) Int. Cl.
| | |
|---|---|
| *B60L 58/26* | (2019.01) |
| *B60L 3/00* | (2019.01) |
| *G01R 31/00* | (2006.01) |
| *H02J 7/00* | (2026.01) |
| *H02J 7/80* | (2026.01) |

(Continued)

(52) U.S. Cl.
CPC .............. *B60L 58/26* (2019.02); *B60L 3/003* (2013.01); *G01R 31/007* (2013.01); *H02J 7/80* (2026.01); *H02J 7/855* (2026.01); *H02J 7/933* (2026.01); *H02P 1/54* (2013.01); *B60L 2200/40* (2013.01); *B60L 2240/545* (2013.01); *H02J 2207/20* (2020.01)

(58) Field of Classification Search
CPC ...... B60L 58/26; B60L 3/003; B60L 2200/40; B60L 2240/545; G01R 31/007; H02J 7/0047; H02J 7/0063; H02J 7/00712; H02J 2207/20; H02P 1/54
See application file for complete search history.

(56) References Cited

U.S. PATENT DOCUMENTS

| | | | |
|---|---|---|---|
| 7,929,323 B2 | 4/2011 | Schmidt | |
| 8,688,318 B2 | 4/2014 | Richards et al. | |

(Continued)

FOREIGN PATENT DOCUMENTS

| | | |
|---|---|---|
| CN | 108859767 | 6/2020 |
| CN | 111525570 | 10/2020 |

(Continued)

OTHER PUBLICATIONS

Written Opinion and International Search Report for Int'l. Patent Appln. No. PCT/US2025/027218, mailed Sep. 22, 2025 (47 pgs).

*Primary Examiner* — Michael C Zarroli
(74) *Attorney, Agent, or Firm* — Schwegman

(57) ABSTRACT

An electrical energy system for a work machine includes a rechargeable electrical energy source to provide electrical energy to power the work machine, multiple energy management devices, and a system controller. The multiple energy management devices each include at least one electrical component. The energy management devices are modular, and the electrical component or components of each energy management device are independently activated for that energy management device. The system controller is configured to activate the at least one electrical component of all the energy management devices in response to a predetermined event, monitor all the energy management devices for faults, and deactivate a portion of the activated electrical components of the energy management devices according to demand on the electric energy system.

19 Claims, 6 Drawing Sheets

600

(51) Int. Cl.
    *H02J 7/90*       (2026.01)
    *H02P 1/54*       (2006.01)

(56)          References Cited

U.S. PATENT DOCUMENTS

| | | |
|---|---|---|
| 9,557,362 B2 | 1/2017 | Bai |
| 11,870,360 B2 | 1/2024 | Kim et al. |
| 2023/0117372 A1 | 4/2023 | Marsolek et al. |
| 2025/0074613 A1* | 3/2025 | Long .................... H02J 7/0063 |

FOREIGN PATENT DOCUMENTS

| | | |
|---|---|---|
| CN | 115416597 | 9/2023 |
| EP | 4307256 | 1/2024 |
| JP | 2009189209 | 8/2009 |
| KR | 20190115065 A | 10/2019 |

* cited by examiner

600

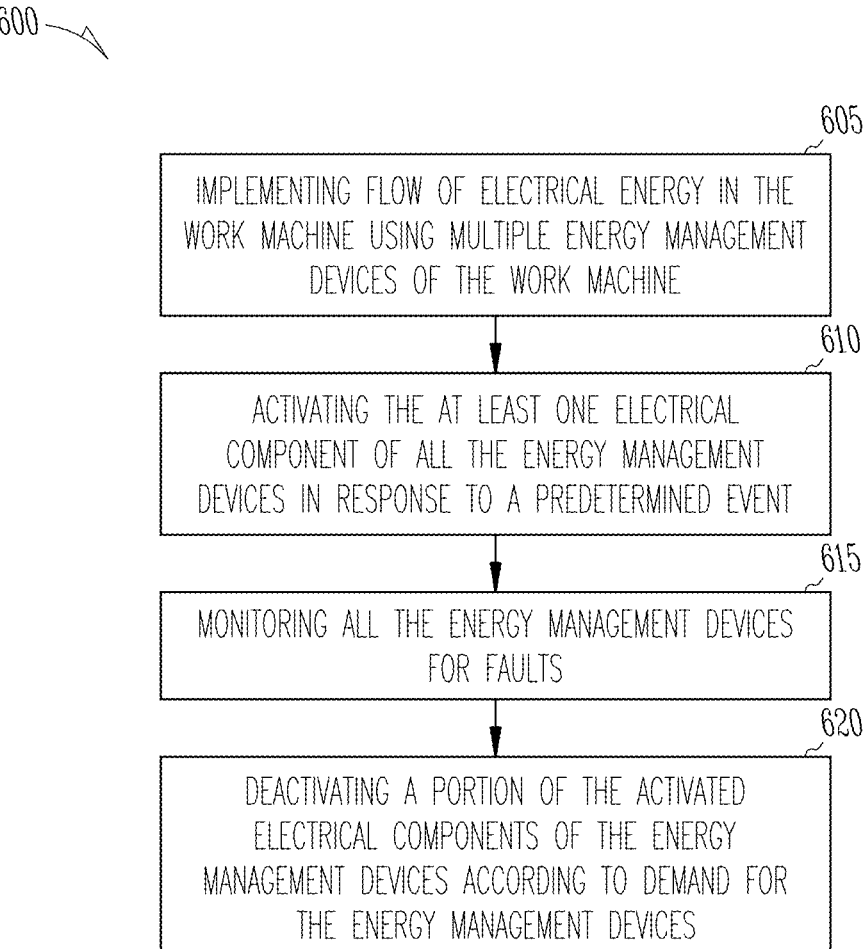

605

IMPLEMENTING FLOW OF ELECTRICAL ENERGY IN THE WORK MACHINE USING MULTIPLE ENERGY MANAGEMENT DEVICES OF THE WORK MACHINE

610

ACTIVATING THE AT LEAST ONE ELECTRICAL COMPONENT OF ALL THE ENERGY MANAGEMENT DEVICES IN RESPONSE TO A PREDETERMINED EVENT

615

MONITORING ALL THE ENERGY MANAGEMENT DEVICES FOR FAULTS

620

DEACTIVATING A PORTION OF THE ACTIVATED ELECTRICAL COMPONENTS OF THE ENERGY MANAGEMENT DEVICES ACCORDING TO DEMAND FOR THE ENERGY MANAGEMENT DEVICES

*Fig. 6*

STARTUP FAULT CHECKING OF PARALLELED DEVICES

TECHNICAL FIELD

This document relates to electric powered work machines and in particular to techniques to monitor the electric energy system of the work machines for faults.

BACKGROUND

Electric large moving non-road work machine (e.g., an electric wheel loader, an electric mining truck, etc.) may use power supplies that produce very high voltages and currents (e.g., hundreds of Volts and Amps). The systems that provide power to electric motors of the work machines may be modularized with different combinations of system modules enabled based on load demands of the work machines. Less power modules may be activated during light system loads and more power modules activated during heavy system loads. Work machines may include safety and diagnostic monitoring devices to monitor the operating status of the power systems. It is desirable to resolve faults detected in the work machines with minimized disruption of use of the work machine. Chinese Patent Publication No. 108859767 B discusses a hybrid electric vehicle DCDC control method that includes starting up a DCDC converter and judging whether there is a fault or not.

SUMMARY OF THE INVENTION

Electric powered large moving work machines use large capacity electric energy systems that provide energy to electric motors and other components of the work machines. Early detection of faults in the energy systems of the work machines can reduce disruption to operation of the work machines at the job site.

An example of an electrical energy system for a work machine includes a rechargeable electrical energy source to provide electrical energy to power the work machine, multiple energy management devices, and a system controller. The multiple energy management devices each include at least one electrical component. The energy management devices are modular, and the electrical component or components of each energy management device are activated independently for that energy management device. The system controller activates the at least one electrical component of all the energy management devices in response to a predetermined event, monitor all the energy management devices for faults, and deactivate a portion of the activated electrical components of the energy management devices according to demand on the electric energy system.

An example of a method of operating an electrical energy system of a work machine includes implementing flow of electrical energy in the work machine using multiple energy management devices of the work machine. The energy management devices are modular, and each energy management device includes at least one electrical component of a same type, and the electrical component of each energy management device can be independently activated for that energy management device. The method includes activating the electrical components of all the energy management devices in response to a predetermined event, and deactivating a portion of the activated electrical components of the energy management devices according to demand for the energy management devices.

BRIEF DESCRIPTION OF THE DRAWINGS

FIG. 6 is a flow diagram of an example of a method of operating an energy system of a work machine in accordance with this disclosure.

DETAILED DESCRIPTION

Examples according to this disclosure are directed to methods and devices with improved fault detection techniques for an electric-powered work machine.

Figure 1:
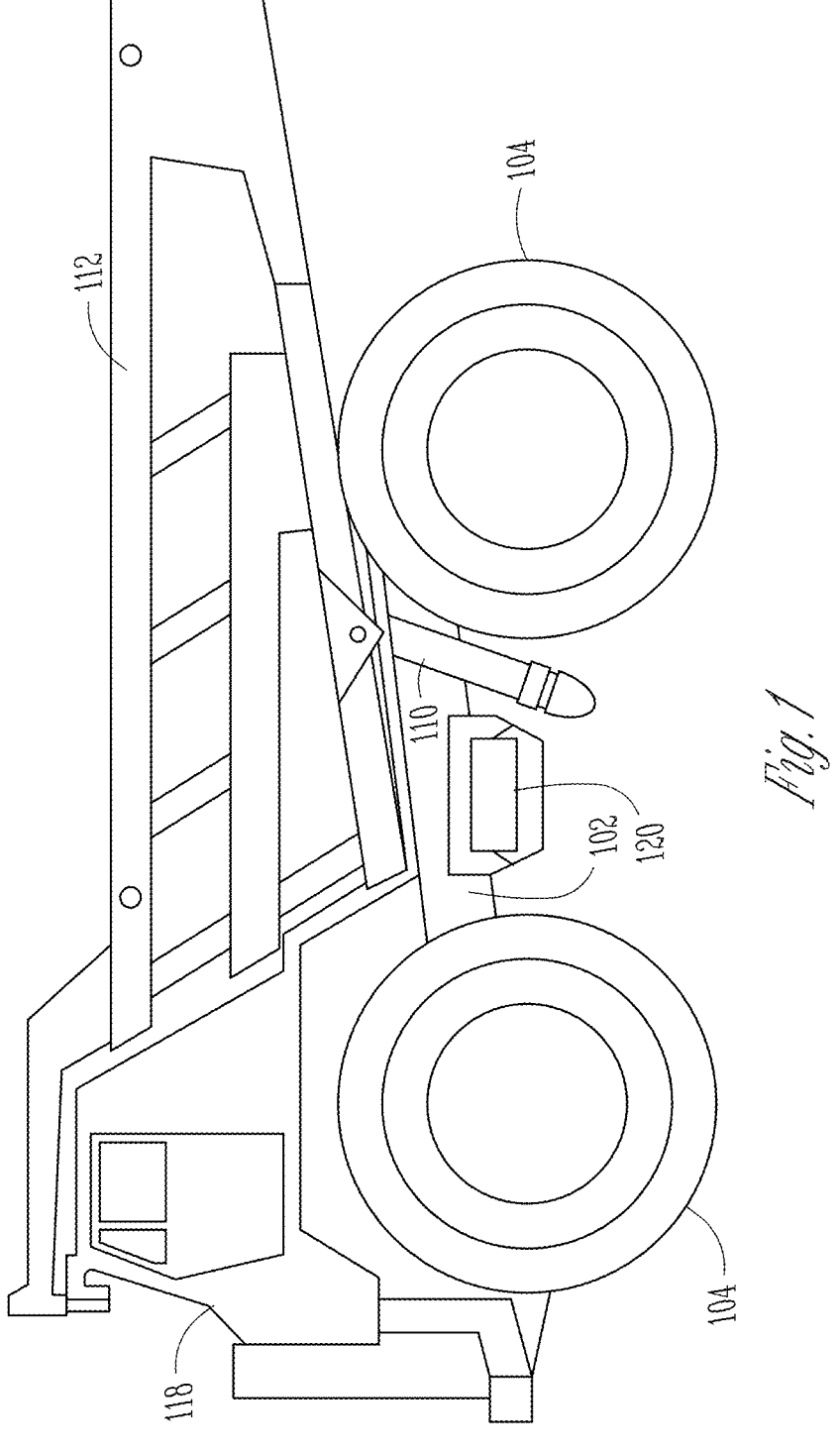
FIG. 1 is an elevation view depicting an example work machine in accordance with this disclosure.

FIG. 1 is an elevation view depicting an example machine 100. In FIG. 1, machine 100 includes frame 102, wheels 104, implement 106, and a speed control system implemented in one or more on-board electronic devices like, for example, an electronic control unit or ECU. Example machine 100 is a material hauler that is a large mining truck. In other examples, however, the machine may be other types of machines related to various industries, including, as examples, construction, agriculture, forestry, transportation, material handling, waste management, marine, stationary power, and so on. Accordingly, although some examples are described with reference to a material hauler machine, examples according to this disclosure are also applicable to other types of machines including wheel loaders, graders, scrapers, dozers, excavators, compactors, marine vessels, locomotives, along with other example machine types.

Machine 100 includes frame 102 mounted on four wheels 104, although, in other examples, the machine could have more than four wheels. Frame 102 is configured to support and/or mount one or more components of machine 100. For example, machine 100 can house, among other components, an electric motor to propel the machine over various terrain via wheels 104. In some examples, multiple electric motors are included in multiple enclosures at multiple locations of the machine 100.

Machine 100 includes implement 106 coupled to the frame 102 through linkage assembly 110, which is configured to be actuated to articulate bucket 112. Bucket 112 may be configured to transfer material such as, soil, ore, or debris, from one location to another. Linkage assembly 110 can include one or more cylinders configured to be actuated hydraulically or pneumatically, for example, to articulate bucket 112. For example, linkage assembly 110 can be actuated by cylinders to raise and lower bucket 112 relative to frame 102 of machine 100.

Machine 100 also includes an operator cabin 118, which can be open or enclosed and may be accessed. Operator cabin 118 may include one or more control devices (not shown) such as, a joystick, a steering wheel, pedals, levers, buttons, switches, among other examples. The control devices are configured to enable the operator to control machine 100 and/or the bucket 112. Operator cabin 118 may also include an operator interface such as, a display device, a sound source, a light source, or a combination thereof.

Machine 100 can be used in a variety of industrial, construction, commercial or other applications. Machine 100 can be operated by an operator in operator cabin 118. The operator can, for example, drive machine 100 to and from various locations on a work site and can also pick up and deposit loads of material using bucket 112. By further way of example, both operation by a remotely located operator and autonomous or robotic operation are contemplated. Machine 100 can include a battery compartment connected to frame 102 and include a battery system 120. Battery system 120 is electrically coupled to the one or more electric motors of the work machine 100.

Figure 2:
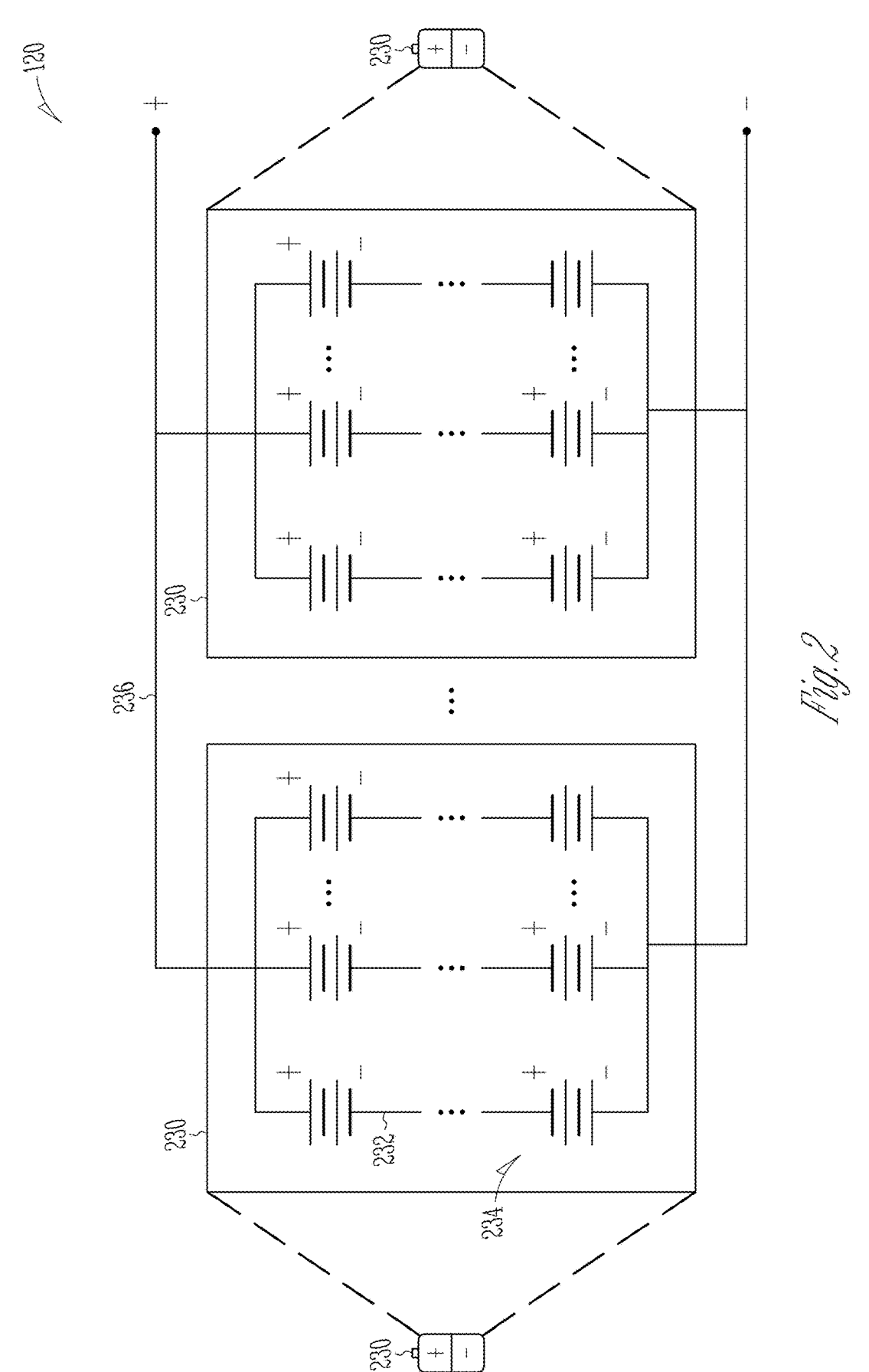
FIG. 2 is a block diagram of a modular battery system in accordance with this disclosure.

FIG. 2 is a block diagram of an electrical energy source to provide power to a work machine (e.g., the machine 100 of FIG. 1). In the example of FIG. 2, the energy source is a modular battery system 120. The battery system 120 can be used to provide power to a work machine, such as the example machine 100 of FIG. 1. The battery system 120 can include multiple battery packs 230 (e.g., two to eight battery packs) connected to a DC battery bus 236 to provide DC power for the machine. Each battery pack 230 includes multiple battery strings 232 (e.g., two to five battery strings). Each battery string 232 includes multiple large capacity batteries 234 or battery cells connected in series. The parallel connection of the large capacity batteries provides high current (e.g., 500 Amps) to the DC battery bus and the series connection of the batteries provides high voltage (e.g., 1200V) to the DC battery bus 236. The work machine can include an electrical energy system to distribute electrical energy of the energy source to components of the work machine. The electrical energy system can include multiple energy management devices to provide different energy management tasks.

Figure 3:
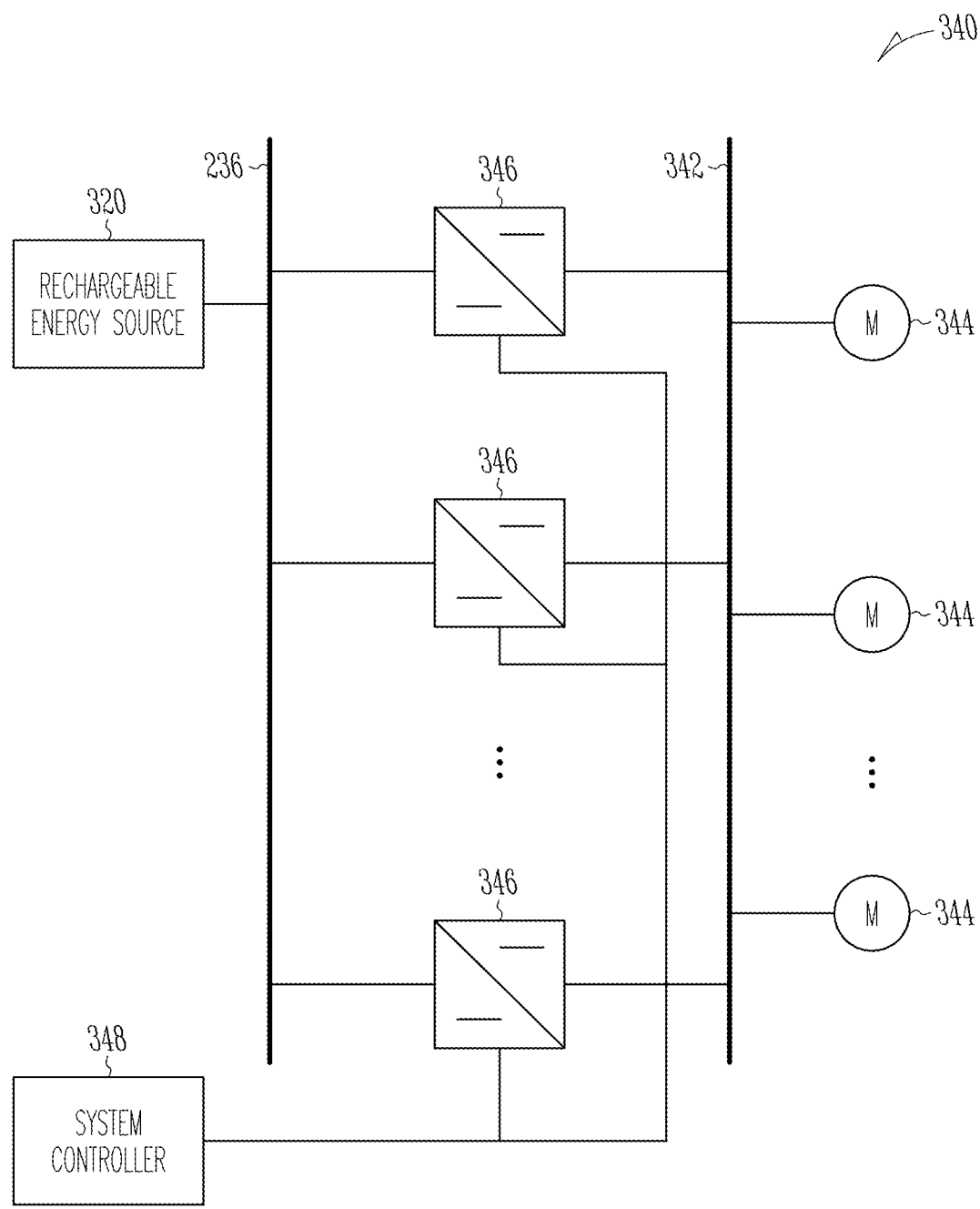
FIG. 3 is a diagram of an example of portions of an electrical energy system for a work machine in accordance with this disclosure.

FIG. 3 is a diagram of an example of portions of an electrical energy system 340 for a work machine. The energy system 340 includes a rechargeable energy source 320 and multiple energy management devices. The energy management devices include electrical components. The energy management devices can include buses in addition to the DC battery bus. For example, the power system of the work machine can include a high voltage traction bus 342 to provide electrical energy to one or more electric motors 344 to drive the wheels of the work machine. The energy management devices can include multiple switching DC-to-DC (DC/DC) converters to decouple the traction bus from the DC battery bus. The power DC/DC converters 346 may be switching converter circuits to boost or step-up the DC voltage of the energy source 320 to the voltage used by the traction bus 342. The power DC/DC converters 346 may operate in parallel to produce power at a higher voltage used by the traction bus. In an example intended to be illustrative and non-limiting, the energy system may use four power DC/DC converters 346 to convert 1200V power at a battery bus to power at 2600V for a traction bus.

The energy system 340 includes a system controller 348 to control activation of the power DC/DC converters 346. The system controller 348 can include logic circuitry to perform the functions described for the system controller 348. The system controller 348 can include one or more processors (e.g., microprocessors, digital signal processors (DSP), application specific integrated circuits (ASICs), a programmable gate arrays (PGAs), or equivalent discrete or integrated logic circuitry). The energy management devices may be modular. For example, the system controller 348 may independently enable one or more power DC/DC converters 346 to provide power to the traction bus based on the demand of the electric motors.

Figure 4:
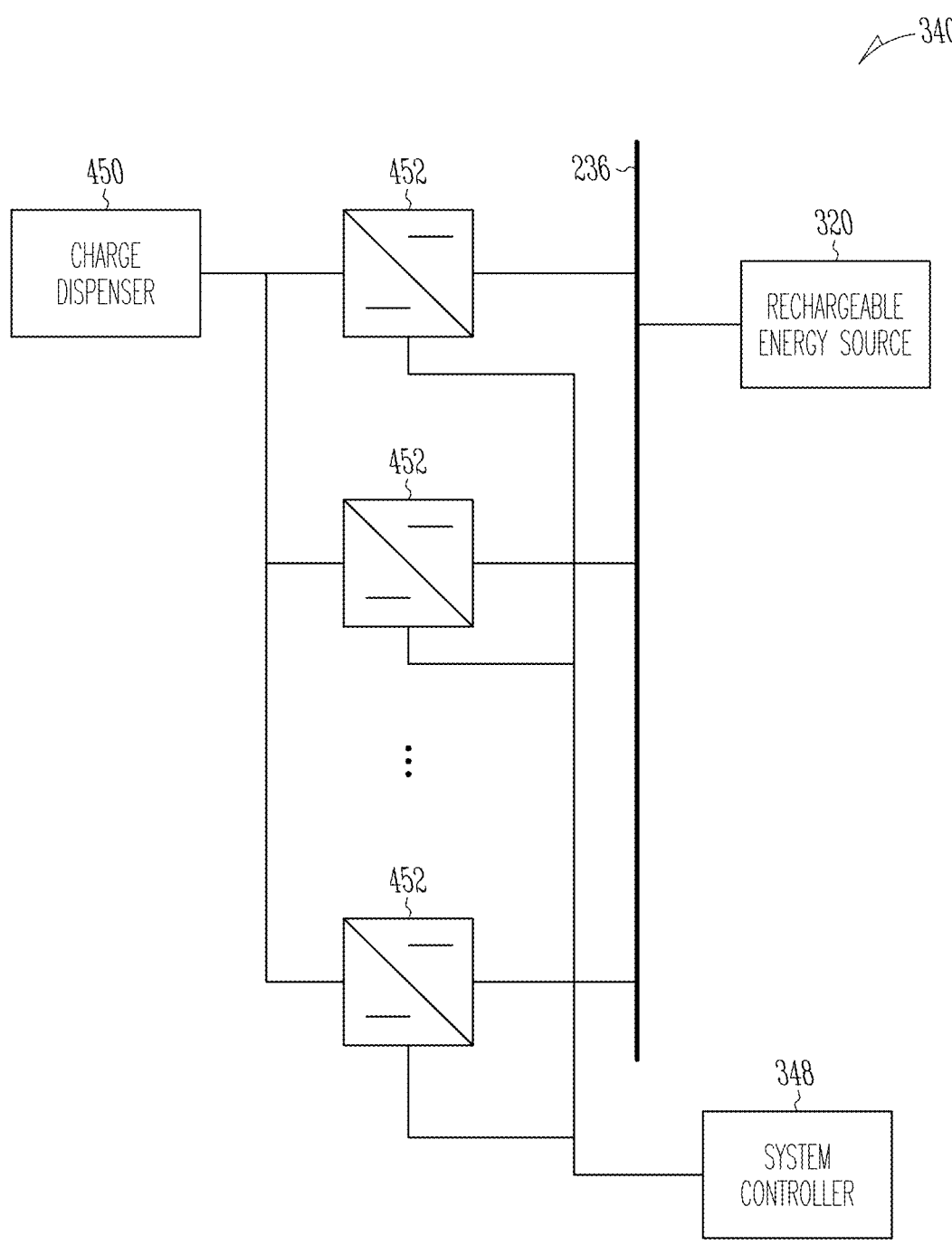
FIGS. 4 and 5 are diagrams of other examples of portions of an electrical energy system for a work machine in accordance with this disclosure.

FIG. 4 is a diagram of another example of portions of an electrical energy system 340 for a work machine. The energy source 320 of the work machine is rechargeable (e.g., the batteries of battery system 120 are rechargeable batteries). The energy system 340 can include a charging system to receive charging energy from a charge dispenser 450 and provide the charging energy to the DC battery bus 236 to recharge the rechargeable energy source 320. Energy management devices of the energy system 340 can include multiple switching DC/DC converters 452 to decouple the charging system from the DC battery bus 236. The charging DC/DC converters 452 may be switching converting circuits that step-down the voltage of the charge dispenser 450 to a voltage used to recharge the energy source 320. The charging DC/DC converters 452 can operate in parallel to produce power at a reduced voltage used to recharge the energy source. In an example intended to be illustrative and non-limiting, the energy system may use two charging DC/DC converters to convert 750V power of the charge dispenser 450 to power at 24V to recharge the energy source 320. Operation of the charging DC/DC converters 452 may be modular. For example, the system controller 348 may independently enable one or more charging DC/DC converters 452 to provide charging energy to battery packs 230 in a charging mode.

Figure 5:
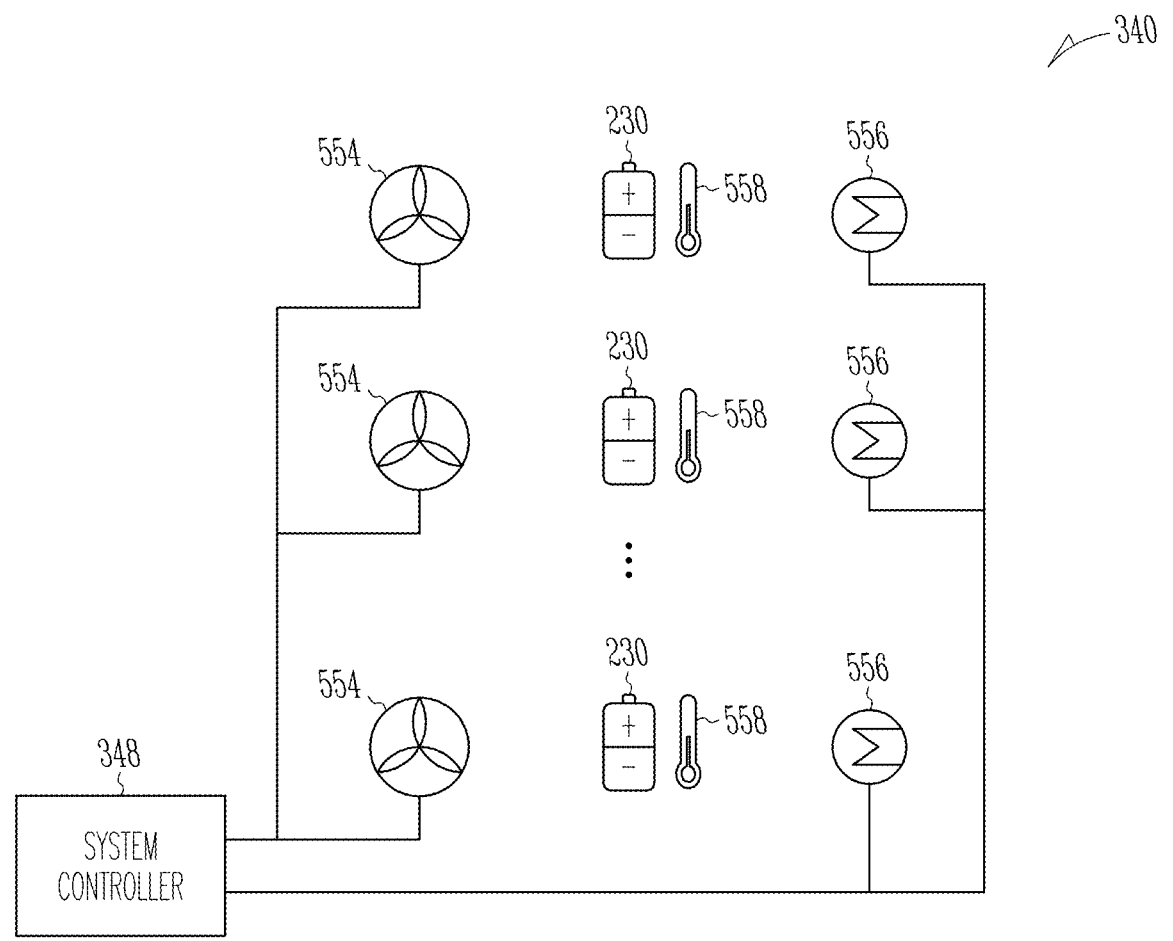

FIG. 5 is a diagram of another example of portions of an electrical energy system 340 for a work machine. The diagram shows the battery packs 230 of an energy source that is a battery system 120. The energy management devices of the energy system 340 may include multiple cooling units 554 to cool the battery packs 230 of the energy source to prevent over-heating. The example of FIG. 5 shows that the energy system 340 may include a cooling unit 554 for each battery pack 230. In variations, the energy system 340 may include more than one cooling unit 554 per battery pack 230 or one cooling unit 554 may cool more than one battery pack 230.

Energy management devices of the energy system 340 may include multiple heating units 556 to heat the battery packs 230 to improve performance in very cold temperatures. The example of FIG. 5 shows that the energy system 340 may include a heating unit 556 for each battery pack 230. In variations, the energy system 340 may include more than one heating unit 556 per battery pack 230 or one heating unit 556 may heat more than one battery pack 230.

The energy system 340 includes one or more temperature sensors 558. The temperature sensors 558 produce a measurement of temperature associated with operation of the work machine. The system controller 348 activates the cooling units 554 or heating units 556 according to temperature measurements. Operation of the cooling units 554 and heating units 556 may be modular and the cooling units 554 or heating units 556 can be independently activated. In some examples, the energy system 340 includes a temperature sensor 558 for each battery pack 230, and the system controller 348 activates the cooling unit 554 or heating unit 556 for the battery packs 230 according to the temperature measured by the temperature sensor 558 of the battery pack 230. In some examples, a temperature sensor 558 produces a measurement of the temperature of the work machine or environment of the work machine, and the system controller 348 activates the cooling unit 554 or heating unit 556 for the battery packs 230 that are actively charging or discharging according to the temperature measured by the temperature sensor 558.

The power DC/DC converters 346, the charging DC/DC converters 452, the cooling units 554, and heating units 556, are examples of energy management devices of the electrical energy system 340 intended to be non-limiting. The energy system 340 can include other energy management devices that are modular and can be operated singly or in parallel with other devices of the same type. The energy management devices include at least one electrical component, and the electrical components of the individual energy management devices are independently activated by the system controller 348.

The work machine may include diagnostic devices to monitor components of the work machine. For example, the work machine can include diagnostic devices to monitor energy management devices that power the work machine, such as by monitoring the status of the traction bus. The work machine may include diagnostic devices and fault sensors to monitor and detect faults in the charging system, cooling system, heating system, and other systems of the work machine.

Less than all the modular energy management devices may be operating at any time due to the demands of the work machine. For example, at startup only one of the power DC/DC converters 346 may be operating due to low load at startup. Given that only one of the power DC/DC converters 346 may be activated at startup, a fault present on a converter unused at startup may not be evident until the work machine is dispatched and has started work at the job site and the load increases to cause activation of the initially unused power DC/DC converters 346. It would be useful to detect the fault and repair the problem earlier in the process of dispatching the work machine.

In an improved approach, the system controller 348 activates all modular the energy management devices in parallel at startup to detect any faults in the energy management devices. In certain examples, the system controller 348 cycles through activation of all the energy management devices of the same type in turn to detect any faults in the devices of the same type. After activation, the devices that are not needed to support the operating status of the work machine are deactivated to save energy.

For example, the system controller 348 in FIG. 3 may activate all the power DC/DC converters 346 in response to a predetermined event, such as startup of the work machine. The system controller 348 monitors all the power DC/DC converters 346 for faults in operation of the converters. After checking for faults, the system controller 348 deactivates a portion of the activated power DC/DC converters 346 according to demand of the electric motors 344.

In the example of FIG. 4, the system controller 348 activates all the charging DC/DC converters 452 in response to a predetermined event, such as the energy system 340 entering a charging mode and checks for faults. After a predetermined time of checking for faults during the charging, the system controller 348 deactivates a portion of the activated charging DC/DC converters 452 according to charging demand of the energy system 340.

In the Example of FIG. 5, the system controller may activate the cooling units of all the energy management devices in response to startup of one or more electric motors of the work machine and the measured temperature of the energy source or the measured temperature of the work machine. The system controller 348 monitors all the cooling units 554 for faults in operation of the cooling units 554. After checking for faults, the system controller 348 deactivates a portion of the activated cooling units 554 according to operating conditions of the work machine, such as demand on the electric energy system after startup and the temperature. Similarly, system controller 348 may monitor all the heating units 556 for faults in operation of the heating units 556. After checking for faults, the system controller

348 deactivates a portion of the activated heating units 556 according to operating conditions of the work machine, such as demand on the electric energy system after startup and the temperature.

The parallel activation and monitoring for faults can be triggered by events other than startup of the machine or startup of the charging system. For instance, the system controller 348 may activate the electrical components the energy management devices of the same type in response to a scheduled check for faults. The schedule of parallel activation of devices and monitoring for faults may change based on the age of the work machine. In certain examples, the activation and fault monitoring of components may be performed as part of shut down of the work machine. After checking for faults, the system controller 348 deactivates some of the activated electrical components of the energy management devices according to operating conditions of the work machine.

The system controller 348 may respond to detection of faults in the components in various ways. In some examples, the system controller 348 disables the electrical component of an energy management device in response to a fault detected in the electrical component. In some examples, the system controller 348 disables the energy management device having the faulty component and replaces the faulty energy management device with another energy management device. In certain examples, system controller 348 presents an indication of a fault (e.g., on the machine's operator interface) in response to the fault being detected.

The techniques described herein allow for detection of faulty components before the work machine is dispatched and put into use, thereby minimizing the disruption to production.

INDUSTRIAL APPLICABILITY

FIG. 6 is a flow diagram of an example of a method 600 of operating an electric energy system of a work machine. At block 605, the flow of electrical energy in the work machine is implemented using energy management devices of the work machine. The energy management devices include at least one electrical component. The energy management devices are modular in that the electrical component or components can be activated independently for each energy management device by a system controller of the energy system. As described previously herein, some examples of energy management devices include switching converter circuits, battery packs, cooling units, and heating units.

At block 610, a predetermined event is determined by the system controller, and in response to the event the system controller activates the energy management devices and their electrical components or activates the energy management devices of a specific type. Some examples of the predetermined event include startup of the work machine, shutdown of the work machine, and an activation time determined according to a schedule that may be programmed or otherwise designed into the system controller. In some examples, the system controller cycles through activation of the energy management devices of different types in turn.

At block 615, the system controller monitors the activated energy management devices for faults. Some examples of faults that the energy system may monitor for include electrical components of the energy management devices exceeding a specified current limit, a voltage limit, or a temperature limit. Other faults include failure of devices to achieve startup, such as a switching converter failing to produce a specified regulated voltage or current.

At block 620, after checking for faults for a predetermined monitoring time duration, the system controller deactivates a portion of the activated energy management devices according to the operating conditions of the work machine. For example, at startup the system controller may activate all the power DC/DC converters as if there was a large load on the energy system even though there may be a light load on the system at startup. After checking for faults in the DC/DC converters, the system controller deactivates some of the DC/DC converters to only the number of DC/DC converters needed to meet the light load requirements on the system. Only activating the number of devices needed to meet the requirements on the energy system reduces the amount of energy used in operating the work machine and extends the time needed before recharging the energy source.

If a fault in an energy management device is detected, the method 600 may include the system controller disabling the faulty device. The system controller may produce an indication that the device is disabled, such as by presenting the deactivation on a display of the work machine. In some examples, the faulty device is replaced by a parallel device and the system controller activates one or more replacement devices in place of the faulty device to meet the demand on the energy system.

The method 600 described herein allows for optimizing the number of parallel devices to meet the current needs of the energy system without unnecessarily wasting energy. Faults in devices of the energy system not needed early in operation of the work machine under light load are detected before the devices are activated later when the demands on the energy system increase. Detecting faults components before the energy system experiences large loads minimizes the disruption of operating the work machine.

Unless explicitly excluded, the use of the singular to describe a component, structure, or operation does not exclude the use of plural such components, structures, or operations or their equivalents. The use of the terms "a" and "an" and "the" and "at least one" or the term "one or more," and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B" or one or more of A and B") is to be construed to mean one item selected from the listed items (A or B) or any combination of two or more of the listed items (A and B; A, A and B; A, B and B), unless otherwise indicated herein or clearly contradicted by context. Similarly, as used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

The above detailed description is intended to be illustrative, and not restrictive. The scope of the disclosure should, therefore, be determined with references to the appended claims, along with the full scope of equivalents to which such claims are entitled.

What is claimed is:

1. An electrical energy system for a work machine, the system comprising:

a rechargeable electrical energy source to provide electrical energy to power the work machine;

multiple energy management devices that each include at least one electrical component, wherein the energy management devices are modular and the at least one electrical component of each energy management device is independently activated for that energy management device; and a system controller configured to:

activate the at least one electrical component of all the energy management devices in response to a predetermined event for a predetermined time duration;

monitor for faults in the electrical components of all the energy management devices during the predetermined time duration; and deactivate a portion of the activated electrical components of the energy management devices according to demand of the electric energy system after the predetermined time duration.

2. The system of claim 1, wherein the multiple energy management devices are included in a power system and each include a switching converter circuit configured to receive electrical energy from the rechargeable electrical energy source and provide electric power to an electric motor of the work machine; and wherein the system controller is configured to:

activate the switching converter circuits of all the energy management devices in response to startup of one or more electric motors of the work machine;

monitor for faults in operation of the switching converter circuits; and deactivate a portion of the activated switching converter circuits according to demand of the one or more electric motors.

3. The system of claim 1, wherein the multiple energy management devices are included in a charging system and each include a switching converter circuit configured to receive electrical charging energy and provide the electrical charging energy to the rechargeable electrical energy source; and wherein the system controller is configured to:

activate the switching converter circuits of all the energy management devices in response to at least one of the multiple energy management devices entering a charging mode;

monitor for faults in operation of the switching converter circuits; and deactivate a portion of the activated switching converter circuits according to a charging demand of the electric energy system.

4. The system of claim 1, including:

a temperature sensor configured to produce a measurement of temperature associated with operation of the work machine;

wherein the multiple energy management devices each include at least one energy source cooling unit; and wherein the system controller is configured to:

activate the at least one energy source cooling unit of all the energy management devices in response to startup of one or more electric motors of the work machine and the measurement of temperature;

monitor for faults in operation of the energy source cooling units; and deactivate a portion of the energy source cooling units according to demand on the electric energy system and the measurement of temperature.

5. The system of claim 1, including:

a temperature sensor configured to produce a measurement of temperature associated with operation of the work machine;

wherein the multiple energy management devices each include at least one energy source heating unit; and wherein the system controller is configured to:

activate the at least one energy source heating unit of all the energy management devices in response to startup of one or more electric motors of the work machine and the measurement of temperature;

monitor for faults in operation of the energy source heating units; and deactivate a portion of the energy source heating units according to demand on the electric energy system and the measurement of temperature.

6. The system of claim 1, wherein the system controller is configured to activate the at least one electrical component of all the energy management devices in response to a scheduled activation and deactivate the portion of the activated electrical components of the energy management devices according to operating conditions of the work machine.

7. The system of claim 1, wherein the system controller is configured to activate the at least one electrical component of all the energy management devices in response to startup of the work machine and deactivate the portion of the activated electrical components of the energy management devices according to operating conditions of the work machine.

8. The system of claim 1, wherein the system controller is configured to disable an electrical component of an energy management device in response to a fault detected in the electrical component.

9. The system of claim 1, wherein the system controller is configured to:

disable a first energy management device in response to a fault detected in the at least one electrical component of the first energy management device; and activate a second energy management device to operate in place of the first energy management device.

10. The system of claim 1, including:

an operator interface; and wherein the system controller is configured to present an indication of a fault using the operator interface in response to a fault detected in an electrical component of an energy management device.

11. A method of operating an electric energy system of a work machine, the method comprising:

implementing flow of electrical energy in the work machine using multiple energy management devices of the work machine, wherein the energy management devices are modular and each include at least one electrical component of a same type, and the at least one electrical component of each energy management device is independently activated for that energy management device;

activating the at least one electrical component of all the energy management devices in response to startup of the work machine;

monitoring for faults in the activated electrical components of all the energy management devices; and deactivating a portion of the activated electrical components of the energy management devices according to demand of the energy management devices for operating conditions of the work machine.

12. The method of claim 11, wherein the activating the at least one electrical component of all the energy management devices includes activating at least one switching converter circuit included in each of the energy management devices in response to startup of one or more electric motors of the work machine;

wherein the monitoring all the energy management devices for faults includes monitoring for faults in operation of the switching converter circuits; and wherein the deactivating the portion of the activated electrical components includes deactivating a portion of the activated switching converter circuits according to demand of the one or more electric motors.

13. The method of claim 11, wherein the activating the at least one electrical component of all the energy management devices includes activating at least one switching converter circuit included in each of the energy management devices in response to at least one of the multiple energy management devices entering a charging mode;

wherein the monitoring all the energy management devices for faults includes monitoring for faults in operation of the switching converter circuits; and wherein the deactivating the portion of the activated electrical components includes deactivating a portion of the activated switching converter circuits according to a charging demand of the electric energy system.

14. The method of claim 11, wherein the activating the at least one electrical component of all the energy management devices includes activating at least one cooling unit included in each of the energy management devices in response to startup of one or more electric motors of the work machine and a temperature associated with operation of the work machine;

wherein the monitoring all the energy management devices for faults includes monitoring for faults in operation of the cooling units; and wherein the deactivating the portion of the activated electrical components includes deactivating deactivate a portion of the cooling units according to demand on the electric energy system and the temperature.

15. The method of claim 11, wherein the activating the at least one electrical component of all the energy management devices includes activating at least one heating unit included in each of the energy management devices in response to startup of one or more electric motors of the work machine and a temperature associated with operation of the work machine;

wherein the monitoring all the energy management devices for faults includes monitoring for faults in operation of the heating units; and wherein the deactivating the portion of the activated electrical components includes deactivating deactivate a portion of the heating units according to demand on the electric energy system and the temperature.

16. The method of claim 11, wherein the activating the at least one electrical component includes activating the at least one electrical component of all the energy management devices in response to an activation schedule included in a system controller of the electric energy system; and wherein the deactivating the portion of the activated electrical components includes deactivating the portion of the activated electrical components of the energy management devices according to operating conditions of the work machine.

17. The method of claim 11, including:

detecting a fault in the at least one electrical component of a first electrical energy management device of the multiple electrical energy management devices;

disabling the at least one electrical component in response to the detected fault; and activating a second energy management device to operate in place of the first energy management device in response to detecting the fault.

18. An electric energy system of a work machine, the system comprising:

multiple power switching converter circuits, wherein the power switching converter circuits are independently enabled to operate in parallel to provide electrical energy to one or more electric motors of the work machine;

fault sensors configured to monitor operation of the multiple power switching converter circuits; and a system controller configured to:

determine demand for electrical power by the one or more electric motors;

activate all the power switching converter circuits in response to startup of the one or more electric motors for a predetermined time duration;

monitor the fault sensors for indications of a fault in any of the multiple power switching converter circuits during the predetermined time duration; and enable only the power switching converter circuits needed according to the determined demand for electrical power after the predetermined time duration.

19. The system of claim 18, including:

a rechargeable energy source;

multiple charging switching converter circuits, wherein the charging switching converter circuits are independently enabled to operate in parallel to provide electrical energy to the rechargeable energy source;

wherein the fault sensors are configured to monitor operation of the multiple charging switching converter circuits; and wherein the system controller is configured to:

activate all the charging switching converter circuits during a predetermined time duration of charging in response to the electric energy system entering a charge mode;

monitor the fault sensors for indications of a fault in any of the multiple charging switching converter circuits during the predetermined time duration of charging; and enable only the power switching converter circuits needed according to the charge mode after the predetermined time duration of charging.

* * * * *